(12) United States Patent
Schmidt

(10) Patent No.: US 7,132,754 B1
(45) Date of Patent: Nov. 7, 2006

(54) FLIP CHIP STACK

(75) Inventor: Siegmar Schmidt, Simi Valley, CA (US)

(73) Assignee: Alfred E. Mann Foundation for Scientific Research, Santa Clara, CA (US)

( * ) Notice: Subject to any disclaimer, the term of this patent is extended or adjusted under 35 U.S.C. 154(b) by 0 days.

(21) Appl. No.: 11/303,570

(22) Filed: Dec. 16, 2005

Related U.S. Application Data

(60) Provisional application No. 60/663,373, filed on Mar. 17, 2005.

(51) Int. Cl.
*H01L 23/28* (2006.01)
(52) U.S. Cl. .............. 257/778; 257/777; 257/E23.085; 257/E25.013; 438/109
(58) Field of Classification Search ........... 257/778, 257/777; 438/109
See application file for complete search history.

(56) References Cited

U.S. PATENT DOCUMENTS 5,776,797 A * 7/1998 Nicewarner et al. ........ 438/107

OTHER PUBLICATIONS

Allan, R., SIP Raelly Packs it in, Electronic Design, Nov. 29, 2004, ED Online ID# 9175 accessed at http://www.elecdesign.com/Articles/ArticleID/9175/9175.html on Jan. 26, 06.
Riley, G.A., Tutorial 24: Gold Stud Bump Applications, accessed at http://www.flipchips.com/tutorial24.html on Jan. 26, 2006.

* cited by examiner

*Primary Examiner*—Long Tran
(74) *Attorney, Agent, or Firm*—Gary D. Schnittgrund

(57) ABSTRACT

A flip chip stack of integrated circuits for minimum volume packaging with interconnected chips attached to one or two sides of a flexible circuit board where stacking arrangements for two, five and six chips are disclosed.

6 Claims, 4 Drawing Sheets

FLIP CHIP STACK

BACKGROUND OF THE INVENTION

1. Field of the Invention

The present invention is generally directed to packaging techniques for electronic circuitry and in particular vertical stacking and interconnection techniques for a plurality of integrated circuits.

2. Description of Related Art Including Information Disclosed Under 37 CFR 1.97 and 1.98

Implantable medical devices for remedial treatment of and compensation for cardiac, neural and muscular deficiencies are known in the art. These devices range from cardiac pacemakers as described in U.S. Pat. No. 4,712,555 to Thornander, et al., to microstimulators as described in U.S. Pat. No. 6,208,894 to Schulman, et al. Also see R. Allan, "SIP Really Packs It In", Electronic Design, Nov. 29, 2004, pp 45–54. The quest for minimization of such devices has provided, at least in the area of microstimulators, cylindrically shaped devices that range in size of about 6 mm in diameter and about 60 mm in axial length, see for example the device described in Schulman, et al., U.S. Pat. No. 6,315,721 ('721). The device described in '721 is configured so that, the electronics is packaged in a housing in tandem with a wire wound ferrite core used as a source of recharging energy for the device electronics power supply. Furthermore, the electronics themselves are arranged in a lengthwise fashion within the device, thereby adding to the overall length of the device. This configuration ultimately gives rise to the stated overall device length. In view of the implant nature of such medical devices, even still further device miniaturization would prove advantageous to device implantation and extraction as well as patient comfort.

Complex electronic devices typically require a large number of transistors, large enough that a single integrated circuit may not be able to perform all of the needed (or desired) functions. Such devices are typically fabricated from a plurality of integrated circuit chips that are then interconnected via a motherboard or the like, e.g., a hybrid circuit. While the use of flip chips and ball grid arrays (BGAs) are known for simplifying interconnection between the chips (along with wire bonds), such interconnection techniques can use up valuable and sometimes limited internal package volume. For example, U.S. Pat. Nos. 6,164,284; 6,185,452; 6,208,894; 6,315,721; 6,472,991; 6,564,807; and 6,667,923 and co-pending, commonly-assigned U.S. patent application Ser. Nos. 10/280,841 and 10/345,013 describe implantable medical devices and enclosed circuitry that are sized so that they are suitable for injection in a patient's body, i.e., being contained within an elongated housing having an axial dimension of less than 60 mm and a lateral dimension of less than 6 mm. With such limited outer dimensions and accordingly even smaller inner dimensions, the space available for needed circuitry is limited. Accordingly, various forms of stacking (sometimes referred to as 3D or vertical integration) techniques have been proposed. Such techniques require a frame (see for example Isaak, U.S. Pat. No. 6,404,043), interconnect paths at the edge of uniformly sized chips and/or carriers (see for example, Eide, U.S. Pat. No. 4,956,694), or additional vertical interconnect members and/or wire bond interconnects (see for example U.S. Pat. No. 6,133,626) to extend the assembly beyond two oppositely oriented flip chips, i.e., with one chip facing "up" and the other chip facing "down" so that their BGAs can mate together. It is believed that each of these techniques limit the use of valuable package volume.

BRIEF SUMMARY OF THE INVENTION

The present invention is directed to a minimum volume chip stack consisting of at least two integrated circuits or equivalent passive circuit elements mounted to a flexible circuit board. The designs are presented for multiple chips on flexible circuit boards that represent minimum volume and effective volume arrangements for chips positioned on the flexible circuit board.

The novel features of the invention are set forth with particularity in the appended claims. The invention will be best understood from the following description when read in conjunction with the accompanying drawings.

DETAILED DESCRIPTION OF THE INVENTION

Figure 1:
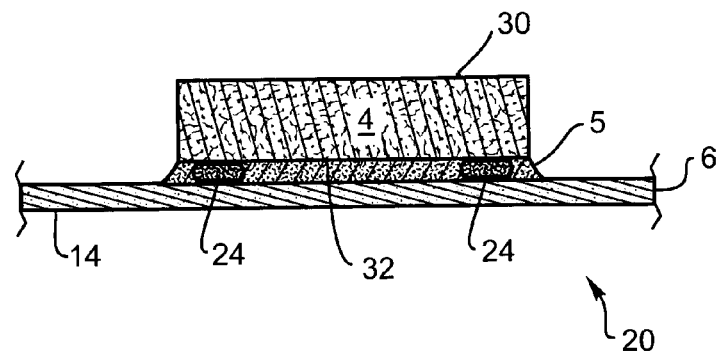
FIG. 1 illustrates a cross sectional view of the integrated circuit flip chip on flexible board.

FIG. 1 provides a cross sectional view of a flip chip on flexible board 20 where integrated circuit chip 4 is bonded by adhesive underfill 5, preferably epoxy, to flexible circuit board 6, which may be comprised of polyimide, such as Kapton®. Bump 24, which may be solder, stud, or epoxy, as is known in the art, provides electrical connection between integrated circuit chip 4 and flexible circuit board 6. A bottom 14 of flexible printed circuit board is indicated. Chip 4 has a top side 30 and a bottom side 32.

Figure 2:
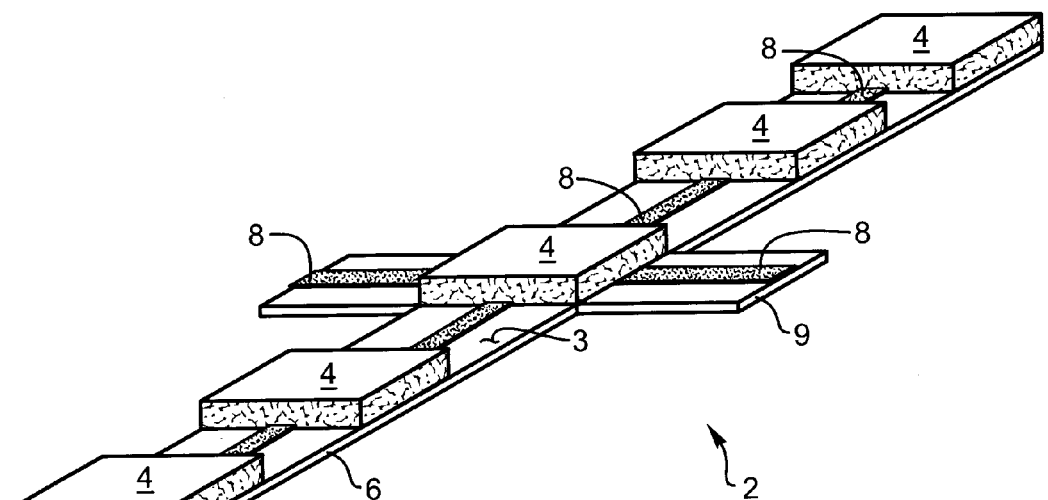
FIG. 2 schematically depicts a perspective view of the integrated circuit chips on a populated printed circuit board.

FIG. 2 presents a perspective view of a printed circuit board 2 populated on one side. Five similar integrated circuit chips 4 are illustrated in a linear unfolded arrangement, although the inventor envisions that the integrated circuit chips 4 may be substituted with other passive circuit elements, such as inductors and capacitors. Electrical signals are transmitted via electrically conductive trace 8. A top 3 of flexible circuit board is illustrated and top 3 is the surface to which the integrated circuit chips 4 are bonded. A main board 9 that is not necessarily flexible is presented. In one embodiment, the electrical connections from the circuit board 2 to other electrical devices are made via main board 9.

Figure 3:
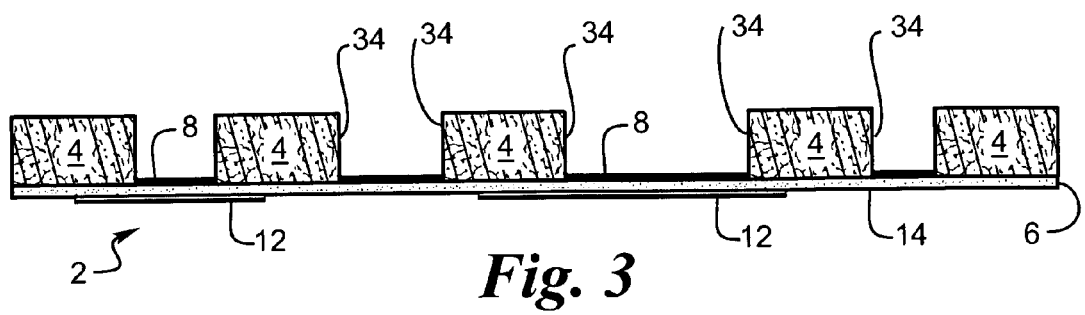
FIG. 3 is a cross sectional view of the flexible printed circuit board.

FIG. 3 presents a side cross sectional view of a one-sided populated printed circuit board 2 showing the flexible circuit board 6 with electrically conductive trace 8 between chips 4 and traces 12 on the bottom 14 of flexible PC board. Chips 4 have edges 34 which face each other.

Figure 4:
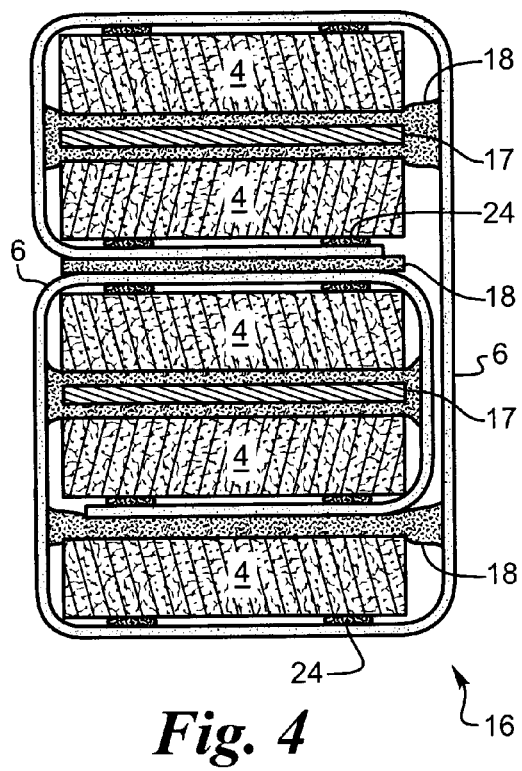
FIG. 4 is a cross sectional view of the stacked integrated circuit chips assembly.

FIG. 4 illustrates a cross sectional view of a one-sided stacked integrated circuit chip assembly 16, generally, where the chips 4 are separated by an insulator spacer 17. The stacked integrated circuit chips are placed along the flexible circuit board in a manner as to yield a minimum stack volume with minimum folding effort of flexible circuit board 6. The chips 4 are electrically connected with bumps 24. Adhesive layer 18 holds the folded stack assembly 16 together.

Figure 6:
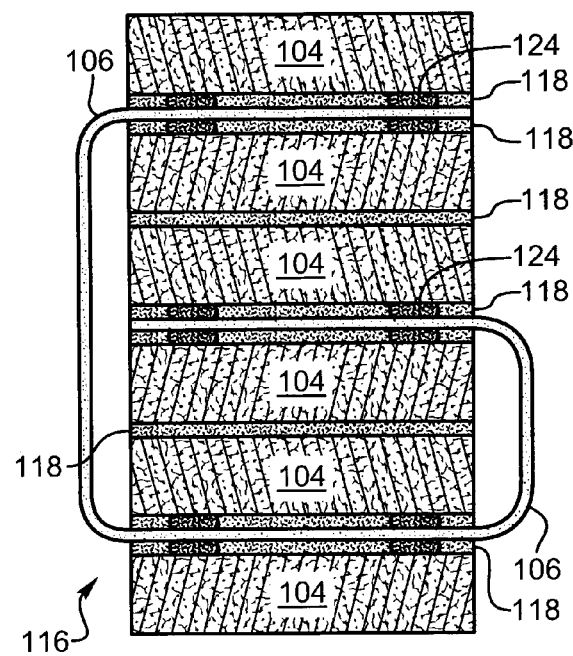
FIG. 6 presents a cross sectional view of the double-sided stacked integrated circuit assembly.
Figure 5:
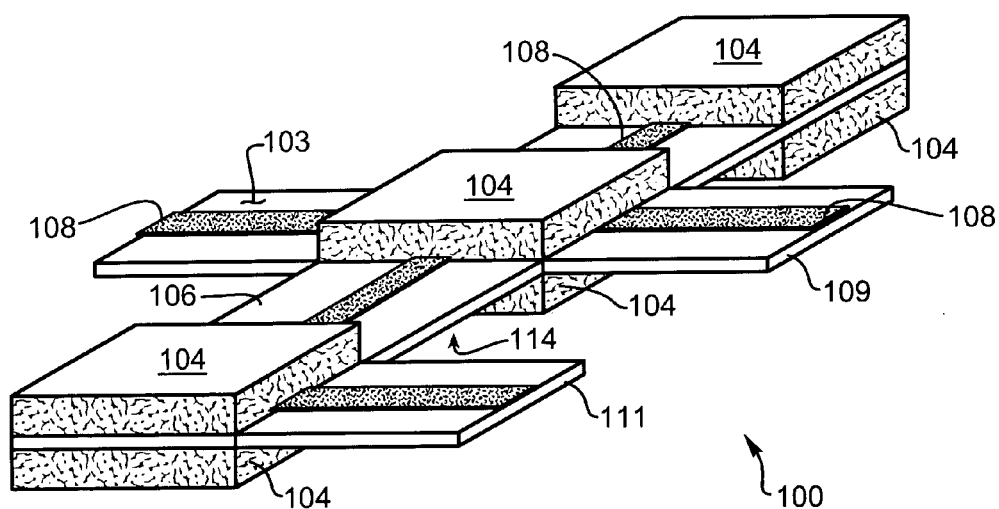
FIG. 5 presents a double-sided populated flexible board.
Figure 7:
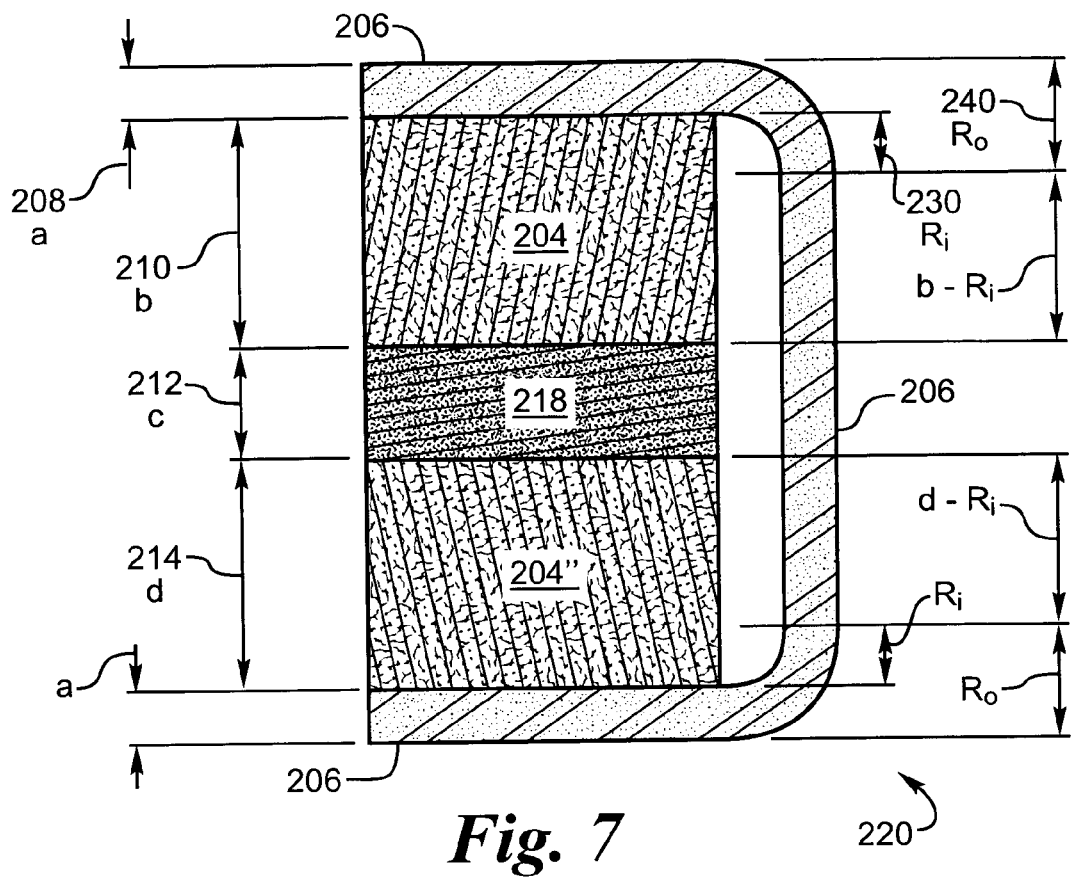
FIG. 7 presents a minimum distance between chips layout.

FIG. 5 illustrates a perspective view of double-sided (i.e., two-sided) populated flexible board, generally, wherein six integrated circuit chips 104 are bonded to the top of flexible circuit board 103 and to the bottom of flexible circuit board 114. Traces 108 are illustrated on the top of board 103, but may also be on the bottom of board 114. Flexible connection flap 104 is illustrated and may be used for crystal mounting, for example. Main board 109 may provide electrical connections from the circuit board 2 to other electrical devices. Proper positioning of the integrated circuit chips 104 on flexible circuit board 106 leads to a maximum stacking density, when the stack is folded, as presented in FIG. 6. A bump 124 is illustrated for electrical connection, as discussed previously. A minimum volume stacked populated double-sided integrated circuit assembly 116 is presented by making short interconnections rather than known wire bonding techniques, for example. Proper positioning of the chips 104 on board 106 lead to the desired minimum volume. In FIG. 7 the thickness 210 of first chip 204', b, plus the thickness 214, d, of second chip 204", plus the thickness, c, 212 of adhesive layer 218 plus the thickness, a, 208 of the two layers of flexible board 206 yield the total chip height.

Figure 11:
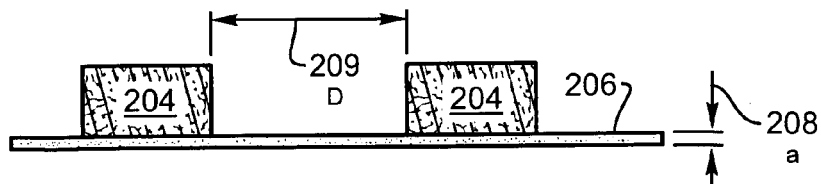
FIG. 11 schematically illustrates the minimum distance between chips.

A folded chip stack for minimum distance between chips 220 is presented in FIGS. 7 and 11. Chip 204 and chip 204' are initially bonded to flexible circuit board 206, which is then folded and held in place with adhesive layer 218. The flexibility and particularly the thickness, a, 208 of flexible board 206 limits the minimum volume achievable since the minimum inner bending radius, $R_i$, 230 of flexible board 206 may be no less than five times the thickness 208. The inner bending radius 230 plus the thickness of the flexible board 206 yields a radius, $R_o$, 240. FIG. 11 presents the distance, D, 209 for a two chip arrangement.

The critical relationship to determine a minimum distance, Dmin, is therefore presented as:

$$Dmin = a(5.5\pi - 10) + [b + c + d]$$

or reducing this to $$Dmin = 7.3a + b + c + d\text{, where a, b, c and d are defined as discussed, FIG. 7.}$$

Figure 8:
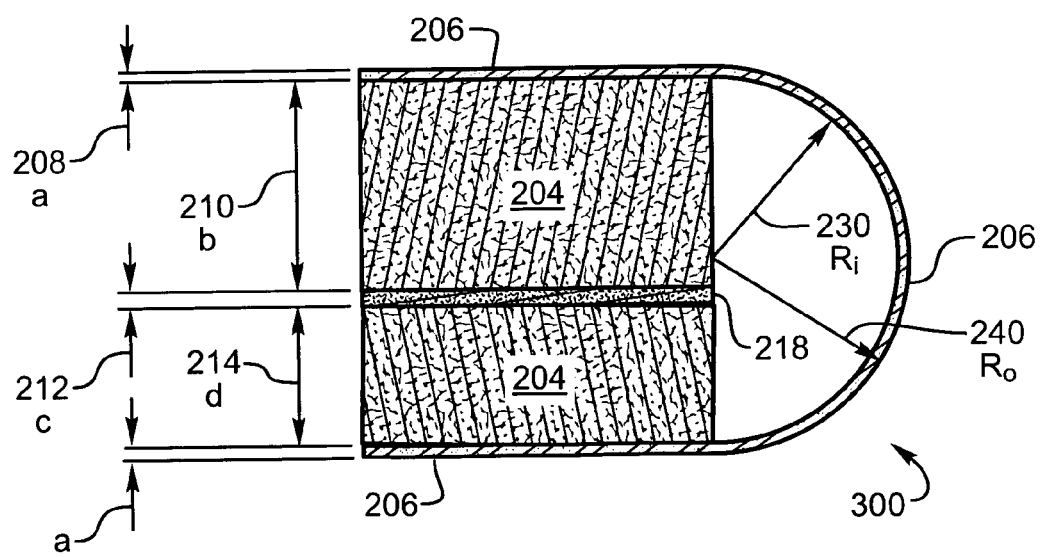
FIG. 8 presents a maximum distance between chips layout.

FIG. 8 illustrates a maximum spacing arrangement for the folded chip stack for maximum distance between chips 300, generally. For example, when it is desired to place the chip stack 300 in a round cross-section tube, or when a maximum effective spacing, Dmax, is desired for D 209, then a configuration as presented in FIG. 8 results, where Dmax, now a maximum effective spacing, is represented by:

$$Ri = (b + c + d)/2$$

$$Ro = Ri + a$$

$$Dmax = (\pi/2)(a + b + c + d)$$

Figure 9:
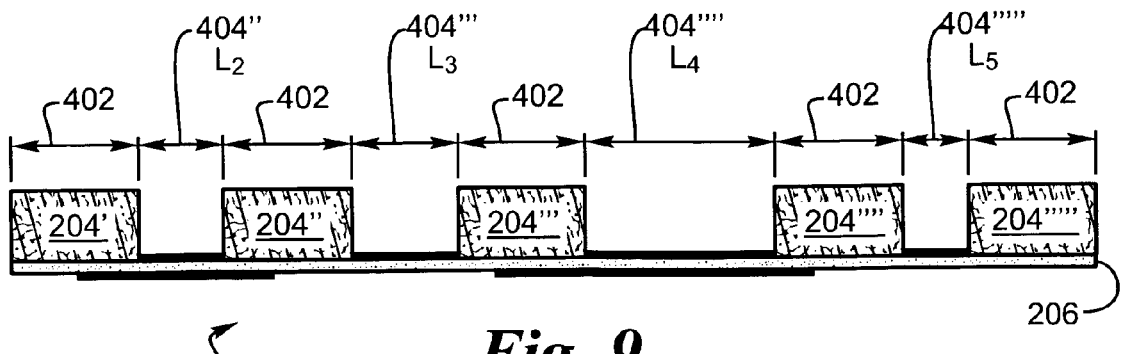
FIG. 9 presents a five chip layout.

FIG. 9 presents a five chip single-sided integrated circuit chip layout 400, where each chip has a constant width 402 for this illustration only, but the widths 402 need not be equal, and first chip 204' is spaced by L2 404" from second chip 204'''. In the event that a given chip or chips 204 are less than width 402, then to achieve the desired chip stack minimum volume the distance L 404 between the chips 204 is increased to include reduction of width of a given chip 204. Similarly, L3 404''' is the distance between chip 204" and chip 204'''; L4 404" " is the distance between chip 204''' and chip 204" "; and L5 is the distance between chip 204" " and chip 204""'.

Figure 10:
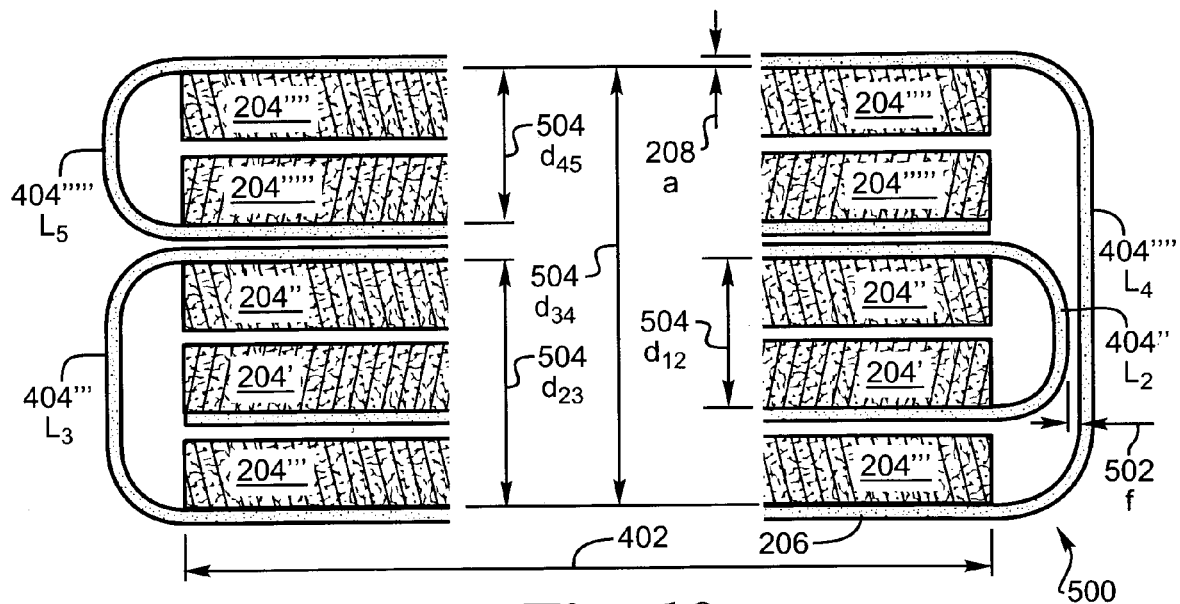
FIG. 10 presents a five chip layout folding scheme.

FIG. 10 presents the stacked populated single-sided integrated circuit assembly 500, where the gap between flexible boards 502 is presented with chips 204 and thickness 208 of flexible board 206. The thickness of a chip stack 504 includes the thickness 208. The minimum distances are therefore:

$$L2 = k + d12$$

$$L3 = k + d23$$

$$L4 = k + d34 + 2f + 2a$$

$$L5 = k + d45\text{, where } k = a(5.5\pi - 10) \text{ and thickness 208 represented herein as a <(distance between two chips including adhesive layer)/10. The quantity "f" 504 represents the distance between the outer surface of the flexible circuit board 206 and the inner surface of the flexible circuit board 206.}$$

Similarly, the maximum effective distances are represented by:

$$L2 = (\pi/2)(a + d12)$$

$$L3 = (\pi/2)(a + d23)$$

$$L4 = (\pi/2)(a + d34)$$

$$L5 = (\pi/2)(a + d45)\text{, where } dij \geq 5a.$$

The height d34 504' is the overall thickness of the stack assembly. The height d12 504" is the height of chip 204' and chip 204"; d23 504''' is the height of chips 204', 204", and 204'''; d45 504"" is the height of chips 204"" and chip 204""'.

It is recognized by the inventors that the optimum stacking arrangement may be between the two arrangements presented as minimum and effective distances.

Obviously, many modifications and variations of the present invention are possible in light of the above teachings. It is therefore to be understood that, within the scope of the appended claims, the invention may be practiced otherwise than as specifically described.

What is claimed is:

1. A flip chip stack (16) comprising:
five integrated circuit chips (204) arranged linearly as a first chip and a second chip next to said first chip, a third chip next to said second chip, a fourth chip next to said third chip and a fifth chip next to said fourth chip, each chip having a height (504), that are bonded to one side of a two-sided flexible printed circuit board (206), said chips oriented a minimum distance (404) from the next circuit chip; wherein
said flip chip stack (16) having an overall height (504'), a height (504") of a first chip plus the height of a second chip, a height (504''') of a first chip plus a second chip plus a third chip, and a height (504"") of a fourth chip plus a height of a fifth chip, said distance (404")

between said first chip and said second chip is k plus the height of the first chip plus the height of the second chip (504"), said distance (404''') between said second chip and said third chip is k plus the height of the first chip, the second chip and the third chip (504'''), said distance (404'''') between said third chip and said fourth chip is k plus the overall height (504') plus 2 times a distance (504) between flexible printed circuit board plus 2 times the thickness (208), and said distance (404''''') between said fourth chip and said fifth chip is k plus the height of the fourth chip plus the fifth chip (504''''), where k is the thickness (208) multiplied by the quantity $5.5\pi-10$; and said flexible printed circuit board has a thickness (208) and a minimum bending radius (240) of about five times the thickness (208) of the flexible printed circuit board (206).

2. The flip chip stack according to claim 1, wherein said flexible printed circuit board is comprised of polyimide.

3. The flip chip stack according to claim 1, wherein said integrated circuit chips are electrically connected to said flexible printed circuit board.

4. The flip chip stack according to claim 1, wherein said chips are bonded by an adhesive epoxy.

5. The flip chip stack according to claim 1, wherein said flexible printed circuit board thickness 208 is less than or equal to a height 504" of a first chip plus the height of a second chip divided by 10.

6. A stack of integrated circuit chips comprising:

five integrated circuit chips arranged linearly on a two-sided flexible printed circuit board as a first chip, a second chip next to said first chip, a third chip next to said second chip, a fourth chip next to said third chip, and a fifth chip next to said fourth chip;

said chips each have a top side and a bottom side, said bottom side is bonded to one side of said printed circuit board and said printed circuit board is folded to form said stack;

the top side of said second chip is adjacent to the top side of said first chip;

the top side of said third chip is adjacent to the bottom side of said first chip with only one layer of said printed circuit board therebetween;

the top side of said fifth chip is adjacent to the top side of said fourth chip; and the bottom side of said fifth chip is adjacent to the bottom side of said second chip with two layers of said folded printed circuit board therebetween.

* * * * *